(12) United States Patent
Lynn et al.

(10) Patent No.: US 6,559,717 B1
(45) Date of Patent: May 6, 2003

(54) METHOD AND/OR ARCHITECTURE FOR IMPLEMENTING A VARIABLE GAIN AMPLIFIER CONTROL

(75) Inventors: Lapoe E. Lynn, Cupertino, CA (US); Samuel W. Sheng, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/880,492

(22) Filed: Jun. 13, 2001

(51) Int. Cl.$^7$ ................................................. H03G 9/00
(52) U.S. Cl. ..................... 330/133; 330/134; 455/240.1; 455/241.1
(58) Field of Search ................................. 330/133, 134, 330/278, 279; 455/240.1, 241.1, 247.1, 251.1, 253.2

(56) References Cited

U.S. PATENT DOCUMENTS

| | | | |
|---|---|---|---|
| 4,292,596 A | 9/1981 | Ishizuka et al. | 330/86 |
| 4,816,772 A | 3/1989 | Klotz | 330/254 |
| 4,870,372 A * | 9/1989 | Suter | 330/280 |
| 5,298,868 A * | 3/1994 | Nagano | 330/129 |
| 5,309,115 A * | 5/1994 | Hashimoto et al. | 330/133 |
| 5,572,166 A | 11/1996 | Gilbert | 330/254 |
| 5,684,431 A | 11/1997 | Gilbert et al. | 330/254 |
| 5,994,961 A | 11/1999 | Lunn et al. | 330/254 |
| 5,999,053 A | 12/1999 | Eschauzier | 330/254 |
| 6,100,761 A | 8/2000 | Ezell | 330/254 |
| 6,333,675 B1 * | 12/2001 | Satio | 330/133 |
| 6,353,364 B1 * | 3/2002 | Klemmer | 330/279 |

* cited by examiner

Primary Examiner—Tuan T. Lam
(74) Attorney, Agent, or Firm—Christopher P. Maiorana, P.C.

(57) ABSTRACT

An apparatus comprising a first circuit and a second circuit. The first circuit generally comprises one or more master amplifiers and a plurality of control amplifiers. The first circuit may be configured to generate a plurality of control signals in response to (i) a first signal related to a desired gain and (ii) a second signal related to a known reference. The second circuit may be configured to generate an output signal in response to (i) an input signal and (ii) the plurality of control signals. The output signal may be amplified with respect to the input signal.

17 Claims, 6 Drawing Sheets

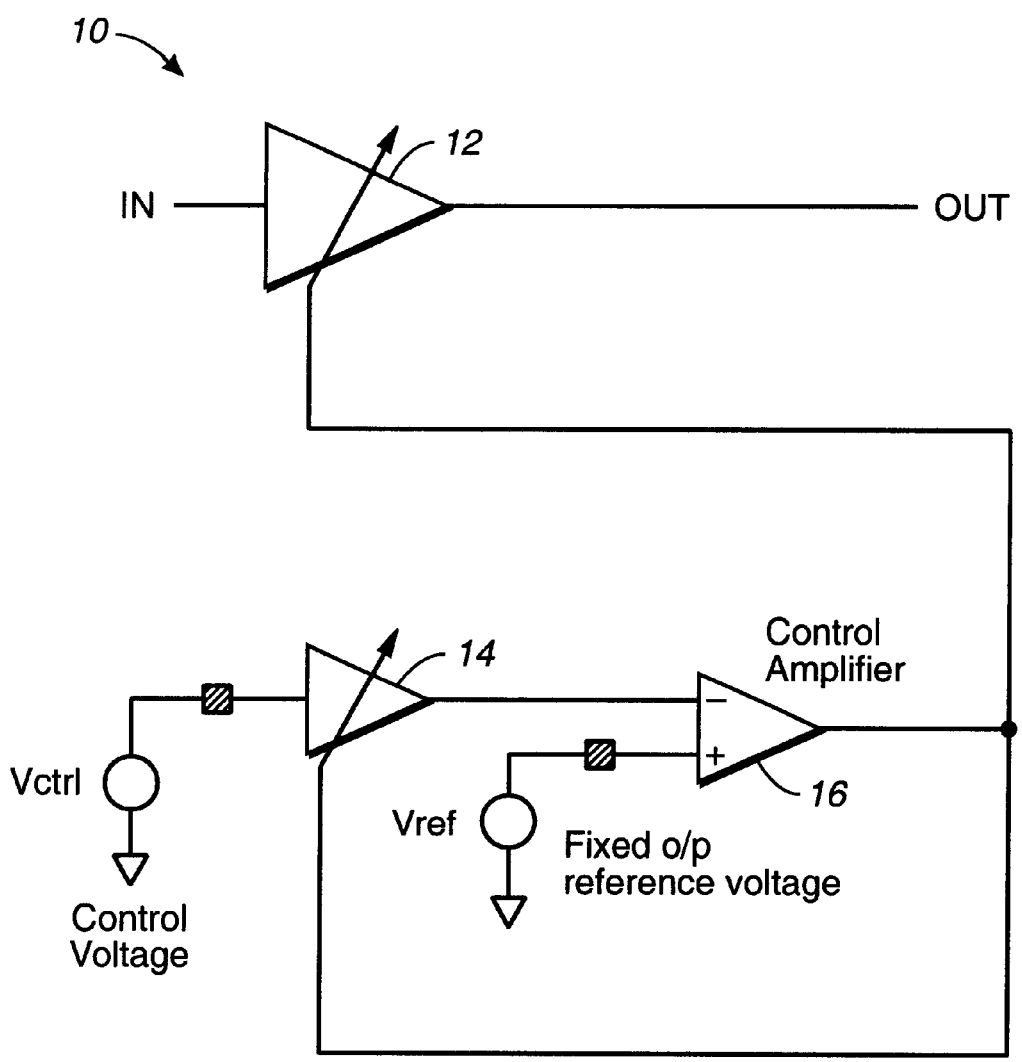
(CONVENTIONAL)
FIG._1

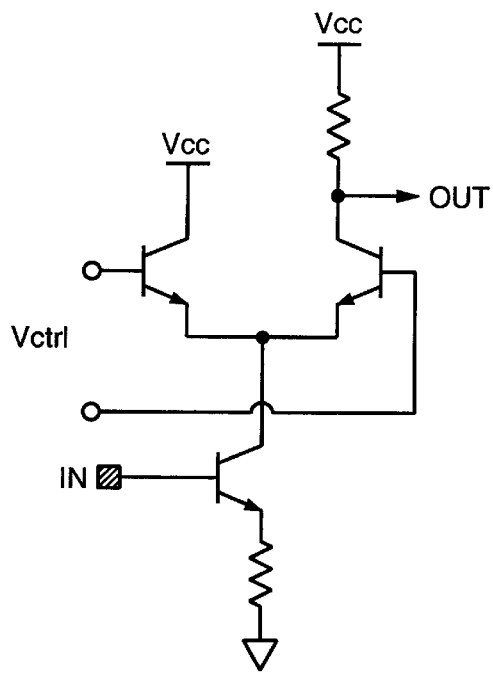
(CONVENTIONAL)
*FIG._2a*
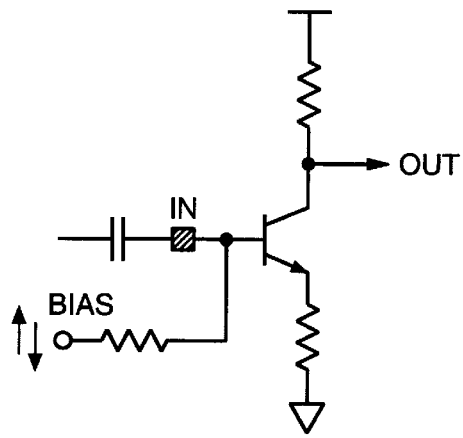
(CONVENTIONAL)
*FIG._2b*
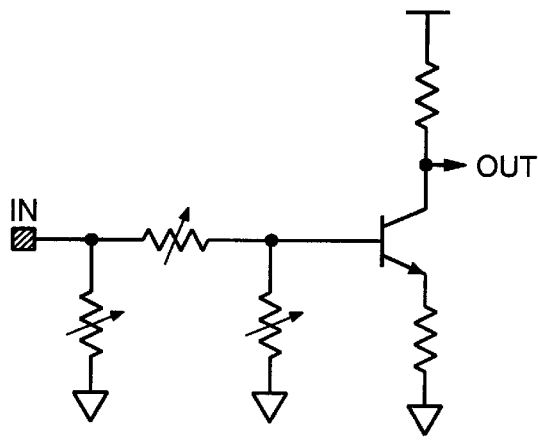
(CONVENTIONAL)
*FIG._2c*
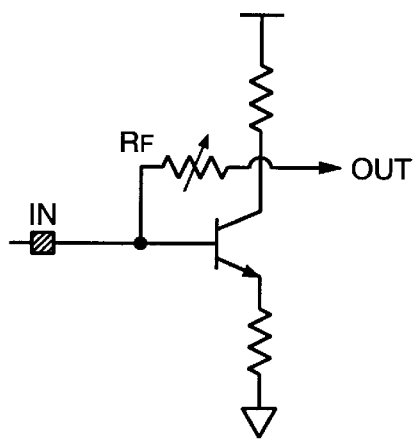
(CONVENTIONAL)
*FIG._2d*

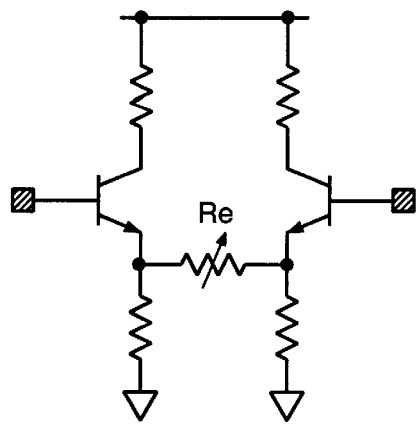
(CONVENTIONAL)
FIG._3a
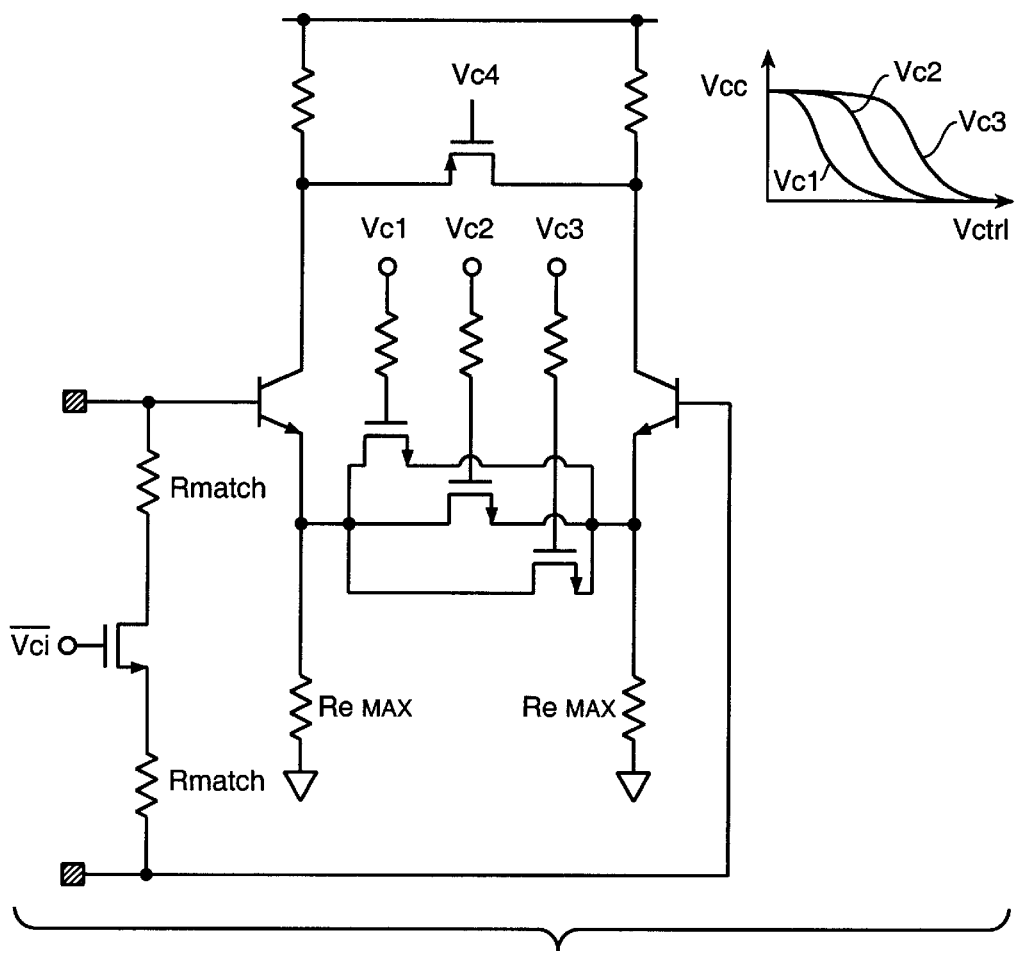
FIG._3b (CONVENTIONAL)

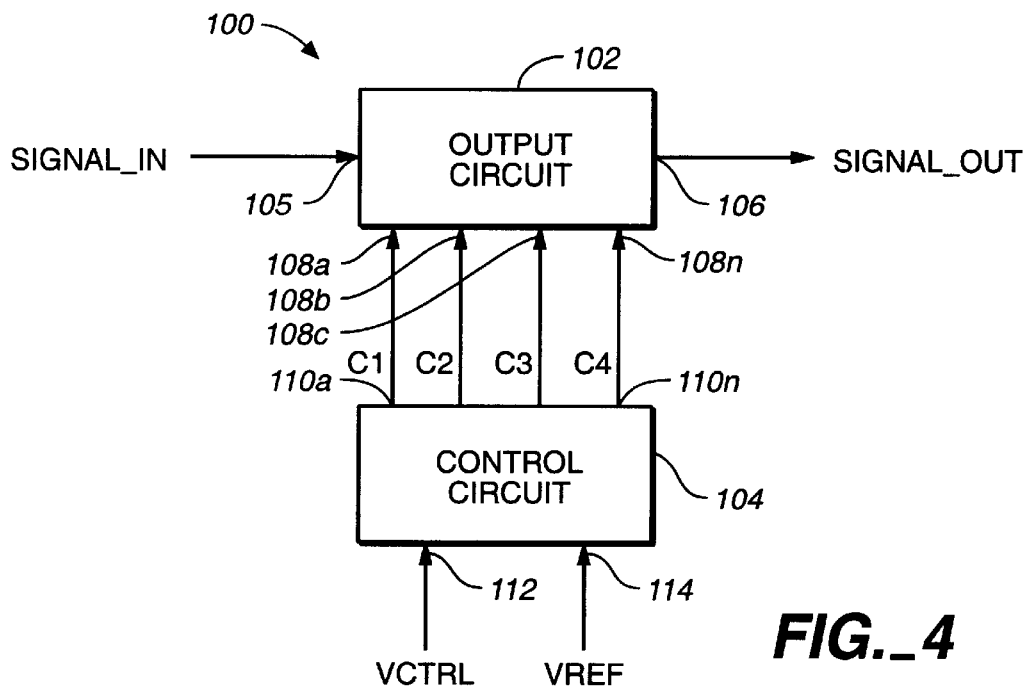
*FIG._4*
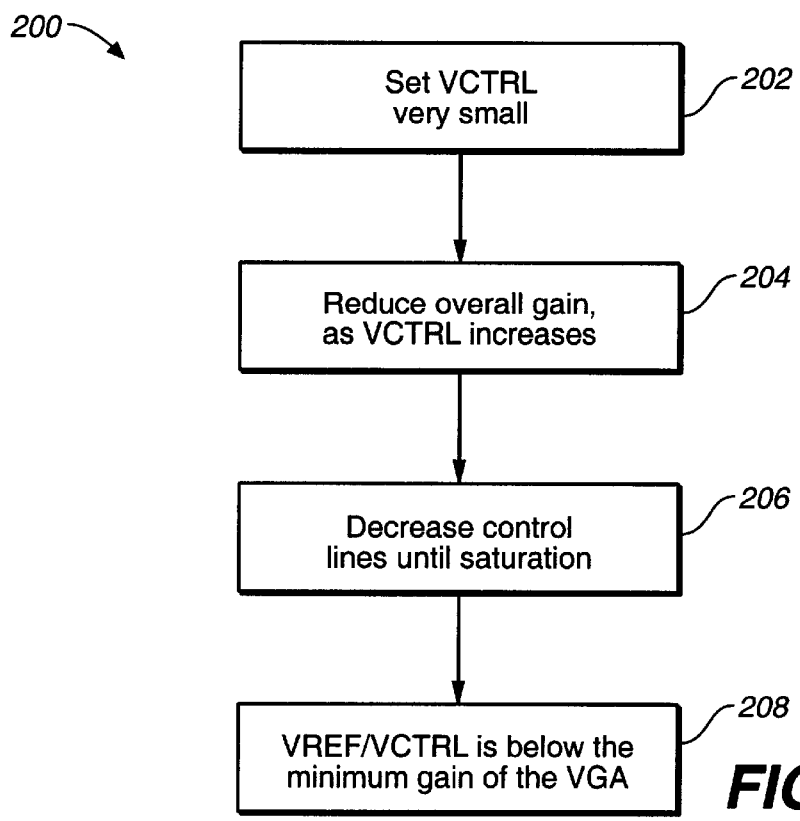
*FIG._6*

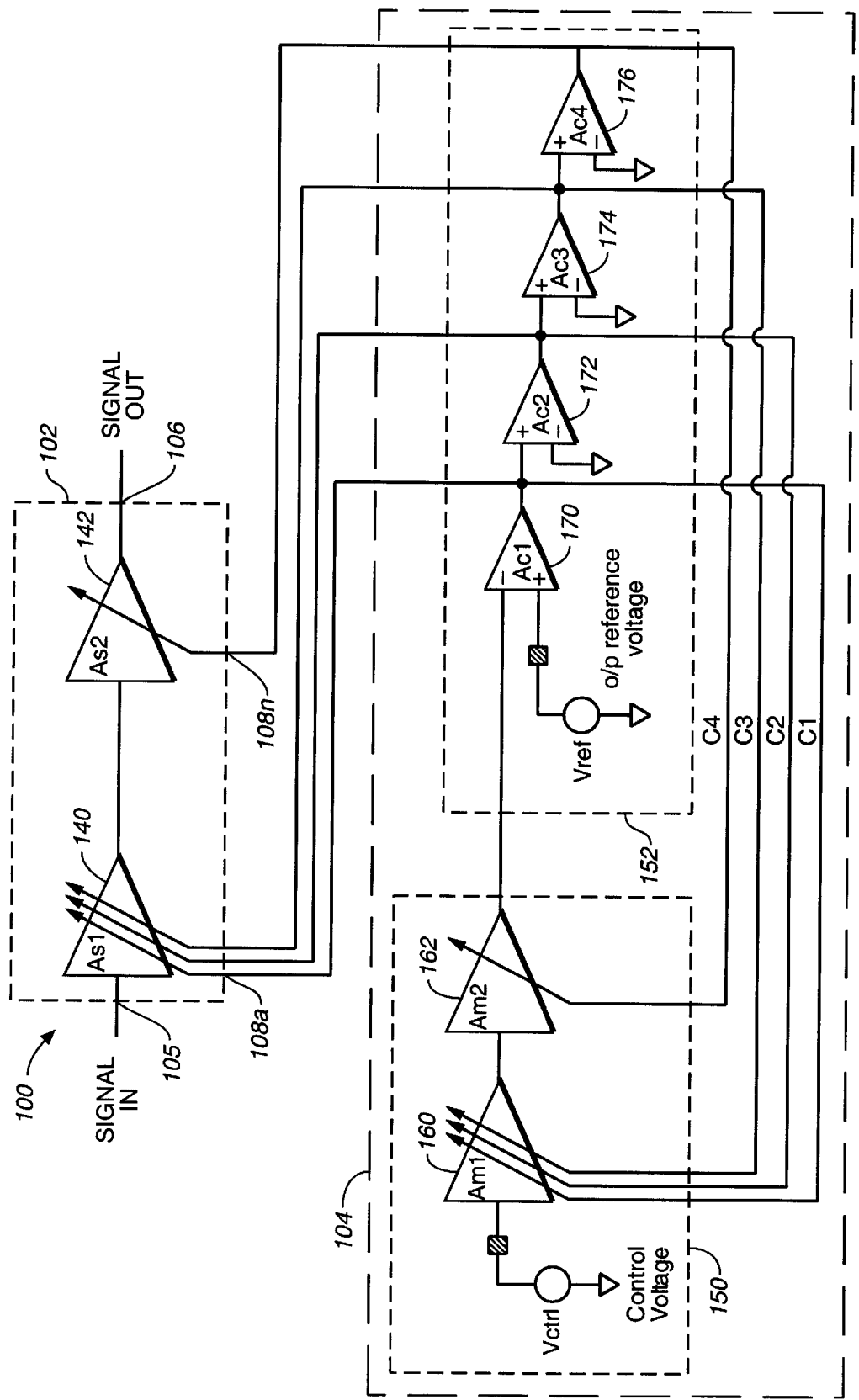
FIG._5

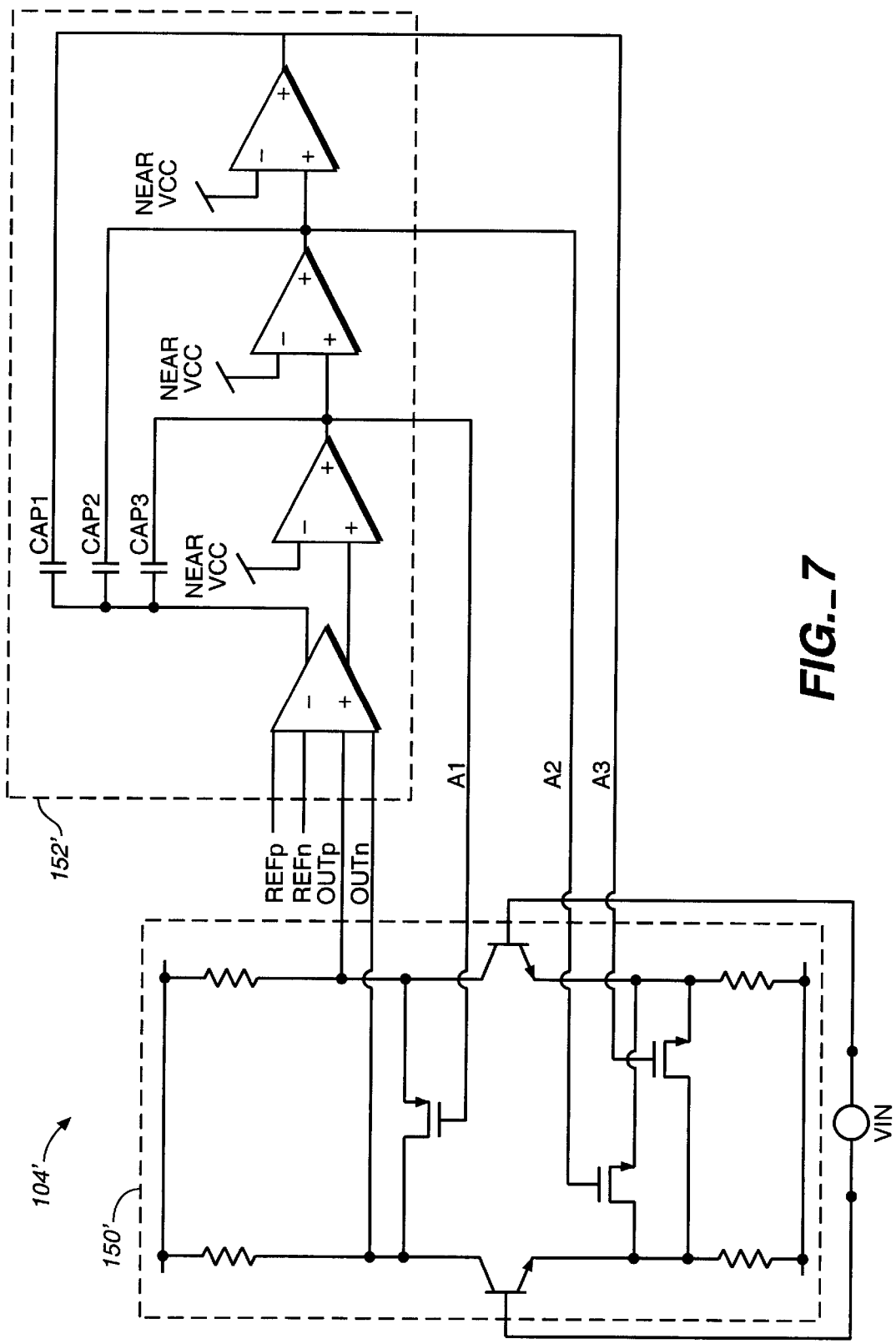
FIG._7

METHOD AND/OR ARCHITECTURE FOR IMPLEMENTING A VARIABLE GAIN AMPLIFIER CONTROL

FIELD OF THE INVENTION

The present invention relates to a method and/or architecture for electronic signal amplification generally and, more particularly, to electronic control of an amount of signal amplification, or gain, provided by a variable gain amplifier (VGA).

BACKGROUND OF THE INVENTION

High performance amplifiers such as those used in the front end of broadband and wireless communication receivers require excellent noise, linearity and bandwidth performance. The performance of the overall system benefits greatly if the front end amplifier can vary the signal gain as the strength of the received signal changes. However, maintaining noise performance, linearity performance and high frequency or broadband operation is difficult in variable gain amplifier (VGA) designs. Even amplifiers with less stringent performance requirements suffer from difficulties in controlling variable gain, since the amount of gain that must be varied (i.e., dynamic range) can often be large. Furthermore, a specific gain-versus-control signal characteristic is often desired (i.e., "linear-in-dB" transfer functions; which are characterized by an exponential change in amplifier gain for a commensurate linear change in control signal).

Referring to FIG. 1, a conventional circuit 10 is shown illustrating a master-slave gain control scheme for variable gain amplifiers. The circuit 10 comprising a variable amplifier 12, a variable amplifier 14 and a control amplifier 16 is shown. A signal IN is presented to the variable amplifier 12 and presented as a signal OUT. The amplifiers 14 and 16 control the variable gain of the amplifier 12.

Currently, most front end amplifiers in high frequency RF receivers (i.e., low-noise amplifiers (LNAs)) have a fixed amount of gain. LNAs with variable gain usually change gain in discrete steps based on a digital control signal (i.e., high-gain mode and low-gain mode.) Some high performance amplifiers use the exponential voltage-current transfer function of bipolar junction transistors (BJTs) to provide linear-in-dB control characteristics by varying the bias of a BJT based amplifier. Other implementations use a master-slave control scheme as illustrated in FIG. 1 to maintain linear-in-dB control (to avoid changing the bias current in the high performance amplifier). Master-slave control schemes have the added advantage of providing preconditioning to the control signal (i.e., temperature compensation, etc.).

Referring to FIGS. 2(a–d), various conventional VGA topologies are shown, each illustrating different gain varying elements and techniques. Referring to FIGS. 3(a–b), various implementations of conventional VGA topologies are shown. FIG. 3b illustrates a conventional VGA with multiple gain elements.

VGAs that change gain in discrete steps can not take full advantage of the signal-to-noise benefits of matching changes in received signal strength with commensurate changes in amplifier gain. Furthermore, control schemes that use multiple digital control signals to provide relatively small discrete gain steps suffer from complicated and undesirable interfaces between the VGA and the additional digital controller. VGAs based on the exponential function of the BJTs suffer from degraded linearity performance when the bias current of the BJT is low. Control schemes which do not rely on the BJT exponential characteristic vary amplifier gain using a variable-resistance, typically as a FET transistor. FET control schemes require a master-slave control loop to achieve a linear-in-dB characteristic. However, FET transistors can also suffer from degraded linearity performance as variable resistance is increased. Moreover, all the control schemes illustrated suffer from limited dynamic range.

SUMMARY OF THE INVENTION

The present invention concerns an apparatus comprising a first circuit and a second circuit. The first circuit generally comprises one or more master amplifiers and a plurality of control amplifiers. The first circuit may be configured to generate a plurality of control signals in response to (i) a first signal related to a desired gain and (ii) a second signal related to a known reference. The second circuit may be configured to generate an output signal in response to (i) an input signal and (ii) the plurality of control signals. The output signal may be amplified with respect to the input signal.

The objects, features and advantages of the present invention include providing a method and/or architecture for electronic control of an amount of signal amplification, or gain, provided by a variable gain amplifier (VGA) that may (i) control multiple control elements, (ii) control multiple VGA stages, (iii) provide a continuous (non-discrete) gain characteristic and/or (iv) improved linearity, noise, bandwidths and dynamic range of the amplifier.

BRIEF DESCRIPTION OF THE DRAWINGS

These and other objects, features and advantages of the present invention will be apparent from the following detailed description and the appended claims and drawings in which:

FIG. 1 is a block diagram of a conventional master-slave control scheme;

FIGS. 2(a–d) are schematics of conventional wideband VGA circuits;

FIG. 3(a) is a schematic of a conventional series feedback VGA circuit and FIG. 3(b) is a schematic of a conventional VGA circuit with multiple gain varying elements;

FIG. 4 is a block diagram of a preferred embodiment of the present invention;

FIG. 5 is a detailed block diagram of the circuit of FIG. 2;

FIG. 6 is a flow chart illustrating an operation of the present invention; and

FIG. 7 is a block diagram of an exemplary alternate implementation of the present invention.

DETAILED DESCRIPTION OF THE PREFERRED EMBODIMENTS

Referring to FIG. 4, a block diagram of a circuit 100 is shown in accordance with a preferred embodiment of the present invention. The circuit 100 may allow for continuous variable gain amplifier control. The circuit 100 generally comprises a circuit 102 and a circuit 104. The circuit 102 may have an input 105 that may receive a signal (e.g., SIGNAL_IN), an output 106 that may present a signal (e.g., SIGNAL_OUT) and a number of inputs 108a–108n that may receive a number of control signals (e.g., C1–C4). The circuit 104 may have a number of outputs 110a–110n that may present the control signal C1–C4. The circuit 104 may also have an input 112 that may receive a signal (e.g., VCTRL) and an input 114 that may receive a signal (e.g., VREF). The signal VCTRL may be a voltage control signal. The signal VREF may be a voltage reference signal. In one example, the circuit 102 may be implemented as an output circuit and the circuit 104 may be implemented as a control circuit.

The present invention may provide a method (or circuit) to control multiple control elements and/or multiple VGA stages within a single master-slave control loop. The multiple-control loop may provide-a continuous (e.g., non-discrete) gain control characteristic from a single global control line generally received from a controller (e.g., the signal VCTRL). By providing multiple control elements and/or multiple stages, the linearity, noise, bandwidth, and dynamic range of the amplifier 100 may be improved. While it may be possible to use a single control line to vary the gain of a number of amplifiers simultaneously, it may be desirable for each variable gain element to be independently controlled (e.g., the control lines C1, C2, C3, and C4), since each element may have a different gain versus control signal characteristic. Furthermore, by independently changing the gain of each gain element, while allowing the others to remain constant, performance metrics such as noise, linearity, and bandwidth may again be optimized. Therefore, the invention may sequentially change a single gain control element at a time while allowing the other control elements to remain constant. The overall master-slave control loop may guarantee that the overall gain versus control characteristic of the VGA 100 matches the desired transfer function (e.g., continuous linear-in-db, temperature compensated, etc.) despite the use multiple gain elements with potentially diverse gain versus control characteristics.

Referring to FIG. 5, a more detailed diagram of an exemplary implementation of the circuit 100 is shown. Other variations of the circuit 100 may be implemented to meet the design criteria of a particular implementation. The circuit 102 generally comprises a circuit 140 and a circuit 142. The circuits 140 and 142 may be implemented as slave amplifiers. The circuit 104 generally comprises a circuit 150 and a circuit 152. The circuit 150 generally comprises a circuit 160, a circuit 162, and an input control signal (or user control signal) VCTRL. In one example, the signal VCTRL may be supplied by a digital to analog converter (DAC) on a controller chip (not shown). However, the signal VCTRL may be supplied by a variety of sources to meet the design criteria of a particular implementation. The circuits 160 and 162 may be implemented as master amplifiers that may control the amplifiers 140 and 142. The circuit 160, the circuit 162 and the signal VCTRL may be serially connected.

The circuit 152 generally comprises a number of circuits 170, 172, 174, 176 and a reference voltage (e.g., VREF). The circuits 170–174 may be implemented as control amplifiers. The circuits 170, 172, 174, 176 and the supply 174 may be serially connected.

Assuming that the control lines C1, C2, C3, and C4 each control a gain-changing element in the master amplifier AM1 (160) and AM2 (162) and the slave amplifiers AS1 (140) and AS2 (142). The gain versus control signal characteristic of each element may be different. Each gain-changing element may have limited dynamic range. For example, any given control element 170–176 may not be able to provide an infinite amount of change in gain and will generally be limited by either the available signal range of the control signal or by saturation of the gain element itself.

For illustration purposes, assume that each control line has the same polarity with respect to the change in gain (e.g., the net gain of the amplifier is increased with an increase in any of the lines C1, C2, C3, or C4). Since the negative feedback loop formed by the master amplifier 150 (AM1 (160) and AM2. (162)) and the control amplifier 152 (AC1 (170), and AC2 (172), and AC3 (174) and AC4 (176)) may try to force the inputs of amplifier AC1 (170) to the same potential, the overall gain of the amplifier 100 may be driven to the ratio VREF/VCTRL. For example, negative feedback of the circuit 100 may naturally move C1, C2, C3, and C4 until the output of the master amplifier 150 is equal to VREF, as shown in FIG. 6.

Referring to FIG. 6, an operation 200 of the present invention is shown. For illustration purposes, the operation of the circuit 100 is described as the gain is changed from a maximum value to a minimum value. While the signal VCTRL need not be changed in any particular order, the description of changing the signal VCTRL from a minimum to a maximum value in order to change the gain of the VGA from a maximum to a minimum value is described for illustrative purposes. While the gain of the circuit 100 may be related to the signal VREF and the signal VCTRL in many ways, the present invention is not limited to a gain that is proportional to VREF/VCTRL. At a state 202, the signal VCTRL may be set to a very small voltage. Since the VGA gain is determined by the signals-VREF/VCTRL, the negative feedback loop may try to force C1, C2, C3, and C4 to maximize the gain of the master amplifier 150. However, if the signal VCTRL exists such that the ratio VREF/VCTRL is large enough to exceed the dynamic range of the VGA 100, C1, C2, C3 and C4 may be forced to maximum signal values and the negative feedback loop-gain in the control amplifier 152 and the master amplifier 150 loop may go to zero. Additionally, the positive "+" and negative "–" terminals of the amplifier 172 may deviate from each other.

At a state 204, as the signal VCTRL is increased in order to reduce the overall gain of the VGA 100, the ratio VREF/VCTRL may eventually fall within the dynamic range of the VGA 100. The positive "+" and negative "–" terminals of the amplifier 170 may be nearly equal. As long as the amplifiers 172–176 each represents a positive DC gain greater than 1 (although typically larger) then one of the lines C1, C2, C3 and C4 may be the only control signal that can deviate from its maximum value. Not until the value of the line C1 approaches the value of the negative terminal "–" of the amplifier 172 does the line C2 begin to deviate from a maximum value. Therefore, as the signal VCTRL is increased, the line C1 may decrease in value (thus lowering the gain of the VGA) until the signal VCTRL nears the negative terminal "–" of the amplifier 172. Subsequently, the line C2 may decrease until C3 begins to decrease from a maximum value.

At a state 206, as the signal VCTRL continues to increase, the line C4 may decrease until either the gain element that the line C4 saturates at a minimum gain, or the control signal C4 saturates at a minimum value. The line C3 may then begin to decrease to a minimum value, followed by the line C2 and the line C1. If the reference signals provided to the negative terminals of the amplifiers 172–176 is selected to be at or near the minimum values that the lines C1, C2, C3, and C4 take, then the lines C1, C2, C3, and C4 may essentially change the gain of the VGA in sequence.

At state 208, VCTRL may be large such that the gain represented by VREF/VCTRL may be below the minimum gain (or attenuation) that the VGA 100 can provide. The control lines C1, C2, C3 and C4 may then be at their minimum values.

Referring to FIG. 7, an exemplary alternate implementation of the control circuit 104' of the present invention is shown. In FIG. 7, the VGA 102 has been omitted in order to clearly illustrate the master 150' and the control amplifiers 152'. However, the VGA 102 may be a (possibly scaled) version of the master amplifier 150'. The control circuit 104' may be implemented as a conjunction of the VGA circuit of FIG. 3b and the circuit 100. The control circuit 104' may additionally require a number of capacitors (e.g., CAP1, CAP2 and CAP3) or a number of control lines (e.g., A1, A2 and A3).

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    a first circuit comprising one or more master amplifiers and a plurality of control amplifiers, wherein (A) said first circuit is configured to generate a plurality of control signals in response to (i) a first signal related to a desired gain and (ii) a second signal related to a known reference and (B) said one or more master amplifiers are configured to receive one or more of said control signals; and
    a second circuit configured to generate an output signal in response to (i) an input signal and (ii) said plurality of control signals, wherein said output signal is amplified with respect to said input signal.

2. The apparatus according to claim 1, therein:
    said first signal comprises a control voltage; and
    said second signal comprises a reference voltage.

3. The apparatus according to claim 1, wherein said second circuit comprises one or more slave amplifiers each configured to respond to one or more of said control signals.

4. The apparatus according to claim 1, wherein said one or more control signals comprise one or more feedback control signals.

5. The apparatus according to claim 1, wherein said plurality of control amplifiers are configured to provide control in continuous increments of said plurality of control signals.

6. The apparatus according to claim 5, wherein said plurality of control amplifiers are configured to provide control in continuous increments through a plurality of amplifier stages.

7. The apparatus according to claim 1, wherein said plurality of control signals comprise a master-slave feedback control loop to control said one or more master amplifiers.

8. The apparatus according to claim 1, wherein said apparatus is configured to provide a continuous gain control characteristic.

9. The apparatus according to claim 6, wherein said continuous control is provided by said first signal acting as a global control line.

10. The apparatus according to claim 1, wherein said apparatus is configured to provide increased linearity, noise, bandwidth, and dynamic range.

11. The apparatus according to claim 1, wherein said first circuit and said second circuit comprise a variable gain amplifier with one or more control elements.

12. An apparatus comprising:
    means for generating a plurality of control signals in response to (i) a first signal related to a desired gain and (ii) a second signal related to a known reference, said means comprising one or more master amplifiers configured to receive one or more feedback control signals and a plurality of control amplifiers; and
    means for generating an output signal in response to (i) an input signal and (ii) said plurality of control signals, wherein said output signal is amplified with respect to said input signal.

13. A method for controlling a variable gain amplifier (VGA), comprising the steps of:
    (A) setting a control voltage to a predetermined value;
    (B) increasing said control voltage to reduce overall gain of the VGA;
    (C) allowing said control voltage to increase and sequentially decreasing a plurality of control signals; and
    (D) setting a ratio of a reference voltage to said control voltage below a minimum gain of the VGA, wherein (i) said plurality of control signals are at minimum values and (ii) said, steps are independently implemented in any order.

14. The method according to claim 13, wherein step (A) further comprises the sub-steps of:
    (A-1) determining said ratio;
    (A-2) forcing a negative feedback loop to maximize the gain; and
    (A-3) when said control voltage exists such that said ratio is above a predetermined threshold, forcing said plurality of control signals to maximum signal values and reducing said negative feedback loop gain to zero.

15. The method according to claim 13, wherein step (B). further comprises the sub-steps of:
    (B-1) allowing said ratio to fall within a dynamic range of the VGA; and
    (B-2) allowing sequential deviation from said maximum values of said plurality of control signals when each one of a plurality of amplifiers represent a positive DC gain.

16. The method according to claim 13, wherein step (C) further the sub-steps of:
    (C-1) saturating a minimum gain of again element of at least one of said plurality of control signals, or saturating at least one of said plurality of control signals at a minimum value;
    (C-2) sequentially decreasing said plurality of control signals to minimum values; and
    (C-3) allowing said plurality of control signals to change the gain of the VGA in sequence.

17. The method according to claim 13, wherein step (D) further the sub-steps of:
    (D-1) providing a minimum gain; and
    (D-2) allowing said plurality of control signals to be at minimum values.

* * * * *